United States Patent [19]

Hubar et al.

[11] 3,868,274

[45] Feb. 25, 1975

[54] METHOD FOR FABRICATING MOS DEVICES WITH A MULTIPLICITY OF THRESHOLDS ON A SINGLE SEMICONDUCTOR SUBSTRATE

[75] Inventors: Robert J. Hubar, Bountiful; Kent F. Smith, Salt Lake City; James N. Fordemwalt, Salt Lake City; John W. Hanson, Salt Lake City, all of Utah

[73] Assignee: General Instrument Corporation, Newark, N.J.

[22] Filed: Jan. 2, 1974

[21] Appl. No.: 430,025

[52] U.S. Cl. .................................. 148/1.5, 148/187

[51] Int. Cl. .............................................. H01l 7/00

[58] Field of Search ........................ 148/1.5 CP, 187

[56] References Cited

UNITED STATES PATENTS

| | | | |
|---|---|---|---|
| 2,787,564 | 4/1957 | Shockley | 148/1.5 |
| 3,575,745 | 4/1971 | Hill | 148/1.5 |
| 3,793,093 | 2/1974 | Nishizawa | 148/1.5 |

*Primary Examiner*—L. Dewayne Rutledge
*Assistant Examiner*—Peter D. Rosenberg

[57] ABSTRACT

The process includes the steps of doping selected portions of the substrate with a dopant of conductivity-determining type opposite the conductivity type of the substrate to form source and drain regions for a plurality of semiconductor devices. A first conductivity-determining type impurity is then introduced into the substrate at the surface thereof in regions corresponding to a first set of selected devices and not in regions corresponding to a second set of selected devices. A second conductivity type determining impurity is then introduced into the substrate of the surface thereof in regions corresponding to the second set of selected devices. The second conductivity type determining impurity is also introduced in regions corresponding to at least some of the first set of selected devices. There may be a third set of selected devices where neither of the conductivity type determining impurities are introduced. The source, drain and gate electrodes for each devices are then formed.

Preferably, the introduction of the conductivity type determining impurities is achieved by means of ion implantation. The resulting substrate may have devices having as many as four different threshold voltages depending upon which, if any, of the impurities are implanted in the channel regions of the particular devices. By controlling the relative impurity concentrations, the threshold voltages of the devices may be accurately determined. Further, the implantation procedures perform the additional function of doping the field areas to substantially reduce parasitic transistor action between the devices caused by field inversion.

19 Claims, 15 Drawing Figures

PATENTED FEB 25 1975

3,868,274

SHEET 3 OF 4

METHOD FOR FABRICATING MOS DEVICES WITH A MULTIPLICITY OF THRESHOLDS ON A SINGLE SEMICONDUCTOR SUBSTRATE

The present invention relates to methods for fabricating metal oxide semiconductor field effect transistors and more particularly to a method of forming a plurality of MOS devices having a multiplicity of thresholds on a single semiconductor substrate.

One of the kinds of semiconductor devices in wide use is known as a metal oxide semiconductor field effect transistor (MOSFET). The basic MOSFET is composed of a substrate or wafer of a first conductivity type which has had two separate spaced regions thereon doped with impurities of a second conductivity-determining type. These doped regions are called the source and drain of the transistor. The region of the substrate which separates the source and drain regions is called the channel region. The substrate is provided with an insulating layer on the surface thereof, normally composed of an oxide of silicon, preferably silicon dioxide. Holes are formed in the insulating layer above the source and drain regions respectively, and a conductive layer is deposited over the surface of the unit. By conventional photo etching methods, the conductive layer is delineated to form the source, drain and gate electrodes of the transistor. The gate electrode normally will cover the entire channel region for the proper functioning of the transistor.

MOSFETS can be formed on P-type silicon substrates with N-type doped source and drain regions or N-type silicon substrates with P-type doped source and drain regions. The former type are referred to as N-channel MOSFETS because the primary charge carriers are electrons, whereas the latter type are referred to as P-channel MOSFETS because the primary charge carriers are holes. It is considered preferable to manufacture MOSFETS of the N-channel type because negative charge carriers have greater mobility than positive charge carriers, thereby permitting the N-channel MOSFETS to function at greater speed. Further, N-channel MOSFETS operate with control voltages which are more compatible with standard bipolar integrated circuits. However, N-channel type MOSFETS are much more susceptible than P-channel MOSFETS to a detrimental electrical property called field inversion, which, unless controlled, causes a parasitic effect between adjacent transistors in the circuit, thereby substantially degrading the performance of the circuit. Therefore, it is necessary to provide some means to eliminate this field inversion problem when N-channel MOSFETS are used.

Both N-channel MOSFETS and P-channel MOSFETS can be divided into two categories; enhancement mode transistors and depletion mode transistors. Enhancement mode transistors are normally nonconductive (have a high resistance between their output terminals) when a biasing voltage of 0 volts is applied to the control terminals thereof. Thus, in order to render an enhancement mode transistor conductive, a voltage of a particular magnitude and polarity (called the threshold voltage) must be applied to the control terminals thereof. On the other hand, depletion mode transistors are normally conductive (have a relatively low resistance across their output terminals) and therefore will exhibit a low resistance across their output terminals even in the absence of a biasing voltage applied to their control terminals. However, depletion mode transistors can be made more conductive or completely nonconductive when biasing voltages of appropriate magnitude and polarity are applied to their control terminals.

The threshold voltage, and in a broader sense whether a transistor is an enhancement mode or a depletion mode transistor, is determined by the fabrication process. For instance, if an ion implantation process is utilized, it is known to regulate the type and the concentration of the ion implanted in the channel region to achieve transistors having the desired threshold voltage.

It is desirable to be able to fabricate depletion mode and enhancement mode transistors on the same substrate because certain circuits, such as depletion inverters, require both depletion mode and enhancement mode transistors. A process to achieve this result has been formulated whereby both depletion mode and enhancement mode transistors may be fabricated on a single substrate by means of a single controlled ion implantation. This process is set forth in detail in the copending application of Ser. No. 392,971, filed Aug. 30, 1973, entitled "MOS Integrated Circuit," and assigned to the same assignee as the present application.

As the technology of MOSFET circuits advances, it has been found that certain integrated circuits, notably those utilized in computer memories, can function more effectively if transistors having a multiplicity of different threshold voltages can be fabricated on a single substrate. For example, in a static random access memory, the memory cells utilize depletion load devices with thresholds of −1 volt to minimize circuit size and power. The peripheral circuits use depletion load devices with thresholds of −3 volts to optimize speed and reduce size. Having all the depletion mode devices with the same threshold voltage would be extremely inefficient.

Another aspect which must be considered in the formulation of an acceptable fabrication process for MOSFETS is the parasitic transistor action which occurs between adjacent N-channel transistors. Since an integrated circuit consists of many individual transistors in close proximity and the main electrical conductors which connect them, regions (called the field) of the integrated circuit occur between adjacent transistors which are structurally similar to an individual transistor in that an electrical conductor spans two nonconnected N regions but is separated from them by an insulating layer. Should a voltage on this conductor cause a current to flow between the underlying N regions, a parasitic transistor is formed which is detrimental to the integrated circuit. This effect, known as field inversion, must be eliminated in order to insure the proper functioning of the circuit. Various methods have been designed in order to eliminate this detrimental effect with varying degrees of success. One method of eliminating these parasitic transistors is to design the integrated circuit structure so that field inversion does not occur for any voltage that may be present on any component of the integrated circuit during normal operation. The minimum voltage causing the parasitic transistor action is known as the field inversion voltage. If the field inversion voltage is made substantially higher than the operating voltage of the MOSFET, this effect can be eliminated. It has been found that by the appropriate doping of the field regions, the field inversion voltage may be made substantially higher than the operating voltage of the MOSFETS thereby substantially reducing the detrimental parasitic transistor action. It is, therefore, desirable to formulate a fabrication process which necessitates no additional steps in order to achieve the appropriate doping of the field.

It is, therefore, the prime object of the present invention to achieve a fabrication process for formulating metal oxide semiconductor field effect transistors having a multiplicity of thresholds on a single semiconductor substrate.

It is another object of the present invention to provide a process for fabricating MOS devices having a multiplicity of thresholds on a single substrate which also incorporates a field doping procedure which does not necessitate any additional fabrication steps.

It is a further object of the present invention to provide a process for fabricating MOS devices with a multiplicity of thresholds on a single semiconductor substrate which utilizes only conventional process steps and therefore can be performed on conventional processing machinery.

In accordance with the present invention a method is provided for fabricating a plurality of MOS devices having a multiplicity of threshold voltages on a single semiconductor substrate. The method includes the steps of doping selected portions of the substrate with a dopant of conductivity-determining type opposite to the conductivity type of the substrate to form source and drain regions for a plurality of semiconductor devices. A first conductivity-determining type impurity is introduced into the substrate at the surface thereof in regions corresponding to a first set of selected devices and not in regions corresponding to a second set of selected devices. A second conductivity-determining type impurity is then introduced into the substrate at the surface thereof in regions corresponding to the second set of selected devices. The second conductivity type determining impurities are also introduced into the substrate at the surface thereof in regions corresponding to at least some of the first set of selected devices. Further, there may be a third set of selected devices into which neither of the conductivity-determining impurities are introduced.

Preferably, the conductivity type determining impurities are introduced into the substrate by means of an ion implantation process. It is also preferable, during one of the ion implantation processes, to implant a high concentration of impurity throughout the surface of the substrate (except in regions corresponding to transistors which are not to receive that particular implant) and then reduce the concentration of these impurities in the channel regions of the implanted transistors, causing the field to have a relatively high impurity concentration which increases the field inversion voltage.

Therefore, it is possible through the process of the present invention to provide a substrate having five different impurity concentrations, four of which account for devices having four different threshold voltages and the fifth impurity concentration in the field regions such that the field inversion voltage is substantially increased. Aside from the additional implantation step, this method requires no additional processing steps other than those necessary to achieve devices having two different thresholds.

Broadly considered, the process of the present invention results in devices having a variety of thresholds through careful control of the relative impurity concentrations introduced into selected areas of the substrate. Enhancement mode devices are produced on a P-type wafer by covering the depletion mode devices during a P-type impurity implant. The concentration of the P-type impurity is controlled to achieve the desired threshold voltage. The depletion mode transistors are formed by masking the enhancement mode transistors during the introduction of the N-type impurity. Again, concentrations are carefully controlled to achieve the desired threshold voltages. By masking certain transistors during both implantation procedures, devices are formed which have a threshold voltage determined solely by the properties of the original substrate material. Moreover, by exposing certain devices to both implants, while carefully controlling the concentration of each impurity, a fourth threshold voltage is achieved which is determined by the aggregate effect of the relative concentration of each of the impurities.

Thus, it can be seen that the type and concentration of the introduced impurities determine the threshold voltages of the device. Selective masking determines which is implanted with which impurity. Control of the concentration level determines the magnitude of the threshold voltage. Since impurity concentration can easily be altered, it is relatively easy to obtain devices having any one of a variety of threshold voltages. Thus, if depletion mode devices are needed with thresholds of −1 and −3 volt, this can be achieved. If other threshold voltages are desired, changes in relative impurity concentrations and/or substrate material can be made to achieve these results.

Although different masks are required for the present invention, no additional process steps (except of the additional implantation step) are required other than those necessary in a process resulting in devices having only two different thresholds. Thus, devices having as many as four different threshold voltages may be achieved using only conventional process steps thereby making the method of the present invention economically desirable as well as technically feasible.

To the accomplishment of the above, and to such other objects as may hereinafter appear, the present invention relates to a method for fabricating a plurality of MOS devices having a multiplicity of thresholds on a single semiconductor substrate as defined in the appended claims and as described in the specification, taken together with the accompanying drawings in which:

The invention will be here specifically disclosed in conjunction with the formation of four metal oxide semiconductor field effect transistors each having a different threshold voltage on a single semiconductor substrate. However, it will be obvious that the techniques disclosed herein in conjunction with the formation of the four MOSFETS can be used simultaneously for all of the MOSFETS in an integrated circuit, if desired, and that fewer or more than four different threshold voltages can be produced on a single substrate by suitable and obvious modifications of the specific teachings.

The process of the present invention utilizes a plurality of impurity introducing steps to introduce impurities of different conductivity-determining types into selected regions of the substrate at carefully controlled concentrations to produce devices with a multiplicity of thresholds. One type impurity of a particular concentration produces devices of a first threshold voltage. Another type of impurity produces devices of a second threshold voltage. In some areas both impurities are introduced and devices of a third threshold voltage are formed. In these areas one impurity will cancel wholly or partially overcome the effects of the other impurity, depending upon the relative concentration thereof. In other areas, no impurities are introduced and devices of a fourth threshold voltage are formed. Various permutations and combinations of relative impurity concentrations permit, through the use of this method, the fabrication of integrated circuits tailor made for specific applications.

The method of the present invention also dopes the field with a high concentration of impurity to reduce field inversion by increasing the field inversion voltage. Although different masks are used, no additional masks or process steps (aside from a single additional implant step) are required other than those utilized in a process to produce devices having only two different thresholds.

Figure 1:
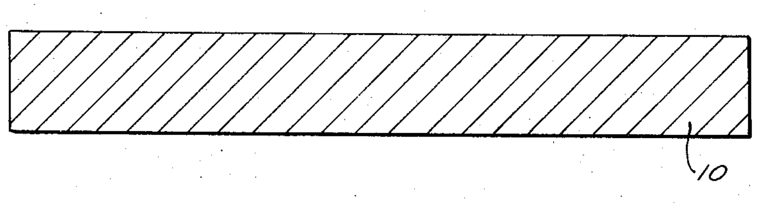
FIG. 1 is a schematic cross-sectional view showing the substrate in its original condition ready for processing.

As shown in FIG. 1, the transistors are formed on a substrate or wafer 10, preferably of monocrystalline silicon. The wafer may be of P-conductivity type or N-conductivity type depending upon the particular use to which the integrated circuit is to be put. For many applications it is desirable to fabricate large MOS integrated circuits with N-channel technology because of the possibility of true compatibility with the common transistor-transistor logic bipolar integrated circuits. By using high resistivity substrates and employing depletion mode MOS transistors as load devices in the logic gates, circuits can be designed which will operate from a single 5-volt power supply at relatively high speeds. Therefore, the present invention is illustrated with a P-type substrate; however, a similar process could be used in conjunction with an N-type substrate, if desired. The wafer 10 is prepared by conventional slicing, polishing and cleaning techniques. The substrate may be sliced on either the (111) or (100) planes, depending upon the threshold voltages desired. For purposes of illustration, the (100) plane has been chosen. The wafer is lapped, cleaned, and degreased and chemically etched to remove the lapping damage on the surface in preparation for the succeeding steps. A substrate with a resistivity range of from 15 to 20 ohm centimeters may be conveniently used.

Figure 2:
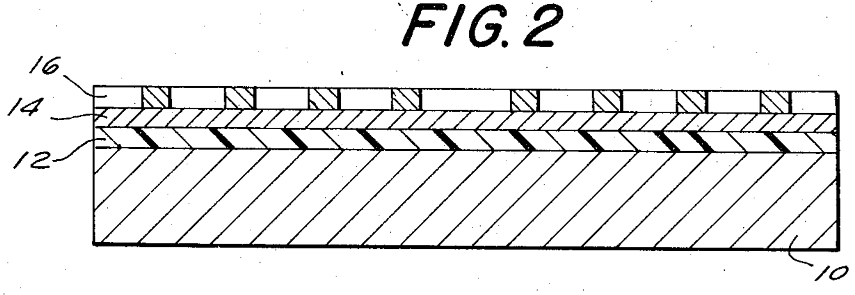
FIG. 2 is a view similar to FIG. 1 but showing an insulating layer formed on the surface of the substrate, a photoresist layer formed on the insulating layer and a mask placed on the photoresist layer.

As shown in FIG. 2, a thin insulating layer 12, preferably of silicon dioxide, is formed on the surface of the substrate. Such a layer may be formed, for example, by thermally oxidizing the wafer at between 850°C and 1,300°C in a furnace in the presence of dry oxygen or water vapor as the suitable oxidizing agent. Preferably, this layer is formed to be about 6,000 Angstroms thick. Layer 12 will ultimately be used as a diffusion mask during the doping operation.

A layer 14 of photoresist is then formed on the insulating layer 12. For example, "KPR" may be used, KPR being a tradename for a product of the Eastman Kodak Company. Layer 14 is dried and heated to form a hard emulsion. An accurately formed high resolution glass emulsion mask 16 is then placed in intimate contact with the top surface of layer 14. Mask 16 has eight opaque portions, each of which corresponds to the desired position of one of the source and drain regions for each of the four transistors to be fabricated.

The unit is exposed to a collimated beam of ultraviolet light which polymerizes the exposed portions of the photoresist layer 14. The mask is then taken off and the unpolymerized portions of the photoresist layer 14 are removed by an appropriate solvent such as xylene. The polymerized portions remain as an adherent etch-resistant pattern.

Figure 3:
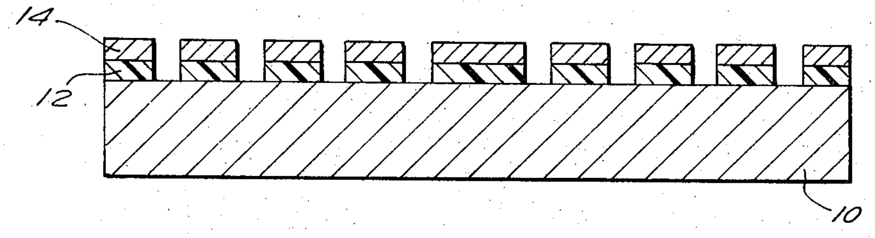
FIG. 3 is a view similar to FIG. 2 but showing the unit after removal of the mask and the portions of the photoresist layer and insulating layer corresponding to the source and drain regions of each device.
Figure 4:
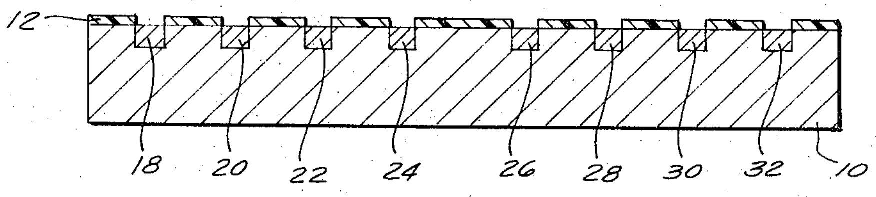
FIG. 4 is a view similar to FIG. 3 but showing the unit after doping and removal of the remaining portions of the photoresist layer as well as a portion of the remaining insulating layer.

A solution of hydrofluoric acid is utilized to etch away the exposed portions of the silicon dioxide layer 12 down to substrate 10. The unit then appears as shown in FIG. 3. The polymerized photoresist layer 14 is then removed by sulfuric acid. With the remaining portions of layer 12 as a mask, the unit is doped by conventional methods such as by spinning on an arsenosilica film followed by a high temperature diffusion step. The use of arsenic as a diffusant simplifies the process in that subsequent high temperature steps do not result in appreciable additional diffusion of the arsenic. The use of arsenic for diffusion also allows close control of the diffusion depths and therefore the spreading of the width of the diffusion regions. The arsenic diffusion source is chosen as arseno-silica film because it is commercially available and can be applied with a conventional photoresist spinner. The arsenic diffusion is controlled to give a sheet resistance of from 17 to 18 ohms per sqaure and a junction depth of 0.9 micron. After diffusion, the arseno-silica film and a substantial portion of the remaining oxide layer 12 are removed and the unit appears as in FIG. 4. Diffused regions 18 and 20 form the source and drain respectively for a first transistor. Diffused regions 22 and 24 respectively form the source and drain regions respectively for a second transistor. Diffused regions 26 and 28 form the source and drain regions respectively for a third transistor and diffused regions 30 and 32 form the source and drain regions respectively for a fourth transistor.

After the source and drain regions for each device have been formed, the wafer is again thermally oxidized to form a second insulating layer 12' of silicon dioxide over the surface thereof. Since oxide layer 12' has approximately the same thickness throughout, indentations are present in the top surface thereof in alignment with the source and drain regions of each of the devices. These indentations are due to the remaining portions of insulating layer 12 in the field regions which cause the combined insulating layer 12, 12' to be slightly thicker in the field regions than in the source and drain regions. These indentations facilitate accurate alignment of the subsequent masks on the unit surface.

The thickness of the oxide in the field regions at this point is of critical importance because if the oxide is too thick an insufficient portion of the atoms to be implanted therein will reside in the silicon. On the other hand, if the field oxide is too thin, the implant will be too deep and the body effect coefficient will suffer. Therefore, in order to preserve the low body effect coefficient characteristic of the high resistivity of the original substrate, the thickness of the field oxide must be carefully controlled. In a typical case, a field oxide thickness of 5,000 Angstroms $\pm$ 50 Angstroms is called for. A convenient method of achieving desired growth thickness control is to make use of a split field, split image microscope in which a comparison is made between the interference color of the wafer in process and the interference color of a reference wafer having a layer of silicon dioxide of accurately known thickness. When making this comparison it is necessary to illuminate both the wafer and the reference with light from the same light source in order to avoid errors resulting from differences in colors from two different light sources. After the thickness of the field oxide has been increased, the wafer is ready to be masked for the first implantation.

Figure 5:
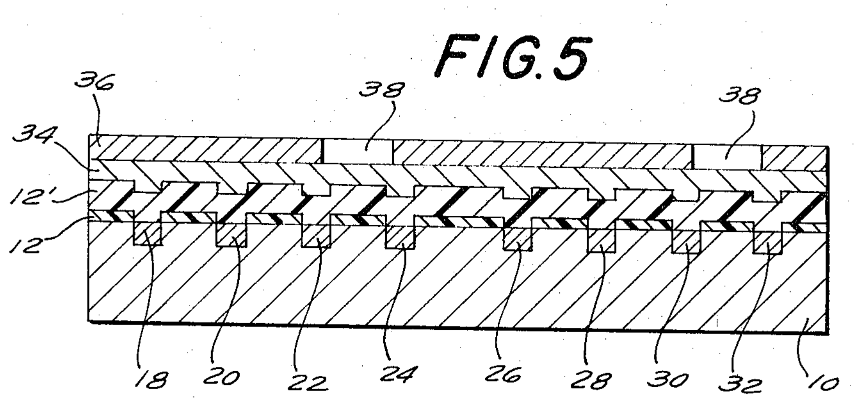
FIG. 5 is a view similar to FIG. 4 but showing the unit after an additional insulating layer has been formed and a second photoresist layer and mask are present on the unit.
Figure 6:
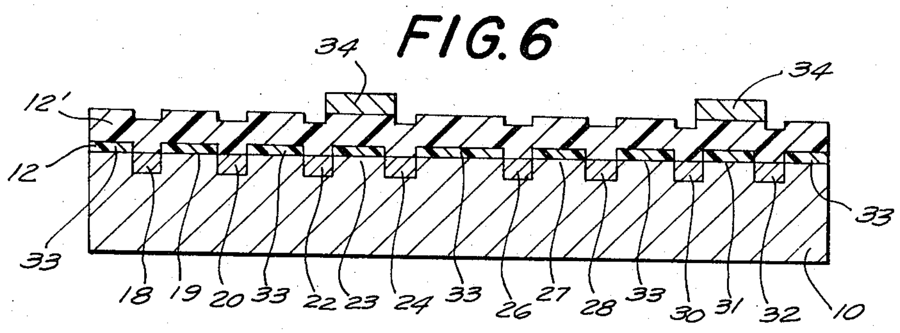
FIG. 6 is a view similar to FIG. 5 but showing the unit after removal of the mask and the photoresist layer in all regions except those aligned with the channel regions of the second and fourth devices.

To that end, a second photoresist layer 34 and mask 36 are formed on the wafer. As shown in FIG. 5, mask 36 has transparent portions 38 which are aligned with the channel regions of the second and fourth transistors. The wafer is exposed to collimated ultraviolet light and the mask and the unpolymerized photoresist are removed. The remaining polymerized photoresist 34 forms an ion implantation mask covering the second and fourth transistors, as shown in FIG. 6.

The unit is exposed to a stream of high energy ions of any appropriate element which will produce P-type regions in the substrate. For example, boron ions have proved effective for this purpose. The energy of the ions is carefully controlled so that they penetrate into substrate 10 in all the areas along the surface of the unit with the exception of the areas covered by photoresist 34. The penetration and concentration of the implanted ions can be accurately controlled through the energy thereof and the exposure time. Preferably, ions of approximately 150 KeV may be used to obtain the desired $3.5 \times 10^{12}/Cm^2$ implant concentration. Implanting the boron ions through 5,000 Angstroms silicon dioxide at this energy level gives the desired impurity distribution. With this distribution and the subsequent minimal heat treatment of the wafer, body effect coefficients typical of that of the starting material only are present.

The boron atoms are present beneath the surface of wafer 10 in the channel regions 19 and 27 of the first and third transistors respectively. In addition, the boron atoms are also present beneath the wafer surface in all of the field areas 33. The areas containing boron atoms are shown as being hatched with lines extending from the bottom of the implanted areas towards the top thereof with a leftward slant.

Figure 7:
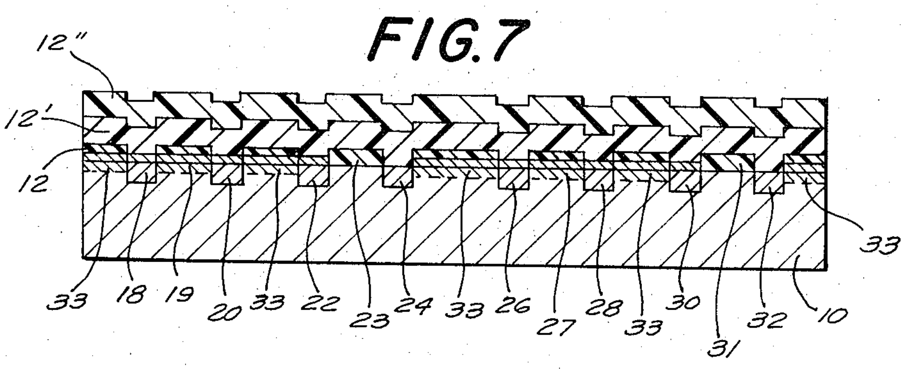
FIG. 7 is a view similar to FIG. 6 but showing the unit after the first ion implantation step has been completed, the remaining portions of the second photoresist layer removed, and the third insulating layer deposited thereon.
Figure 8:
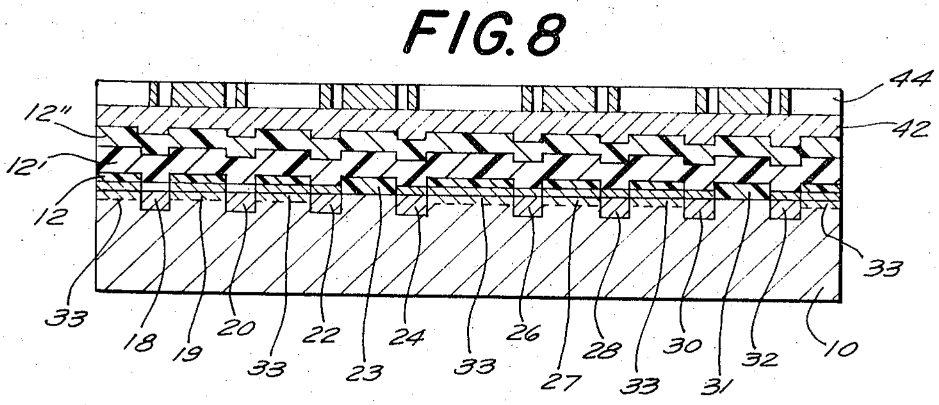
FIG. 8 is a view similar to FIG. 7 but showing the unit with the third photoresist layer and mask present thereon.
Figure 9:
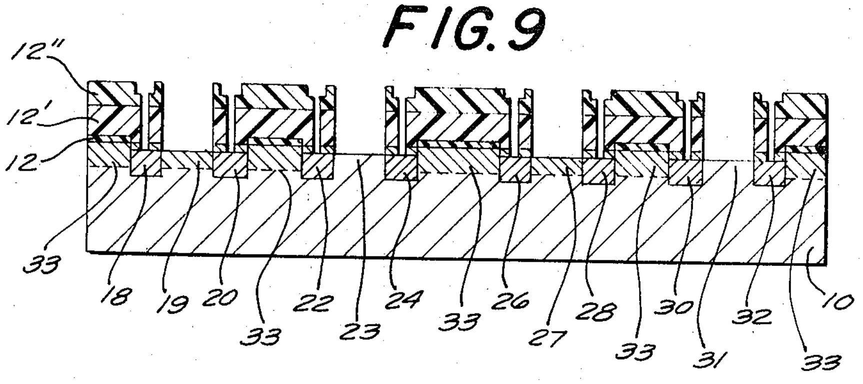
FIG. 9 is a view similar to FIG. 8 but showing the unit after the insulating layers have been removed from the channel, source and drain regions of each device.

The remaining portions of photoresist layer 34 are then removed. An additional layer 12'' of pyrolytic oxide, preferably having a thickness of approximately 5,000 Angstroms is then deposited over the surface of the wafer. This layer 12'' brings the field oxide thickness to a total of 10,000 Angstroms as shown in FIG. 7. A third layer of photoresist 42 and a fourth mask 44 are then formed on top of insulating layer 12''. Mask 44 has opaque regions therein which are aligned with the channel region and the source and drain regions of each of the four transistors respectively. The unit is exposed to a beam of collimated ultraviolet light and the mask and the unpolymerized portions of the photoresist layer 42 removed. The insulating layers present in the channel source and drain regions of each of the transistors are then removed by etching such that the substrate is exposed in the channel regions of each of the transistors as well as in the source and drain regions thereof. The polymerized portions of photoresist layer 42 are then removed. The wafer then appears as shown in FIG. 9.

Figure 10:
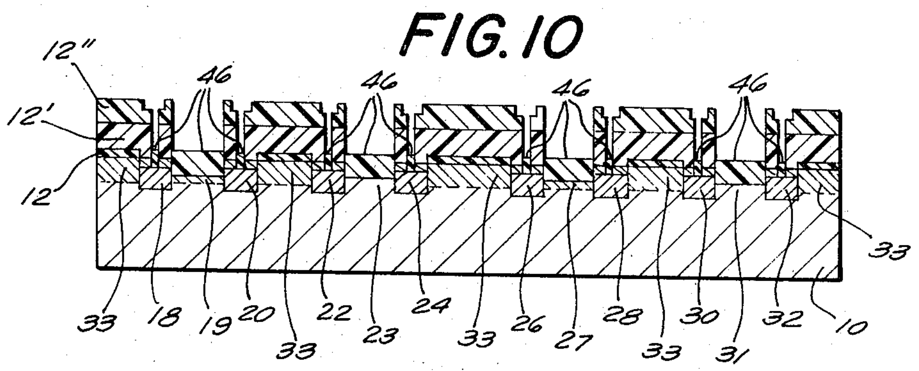
FIG. 10 is a view similar to FIG. 9 but showing the unit after an oxide layer has been grown in the channel source and drain regions of each device.

Next, a layer 46 of silicon dioxide is grown in the regions of silicon exposed in the previous step. This is done by placing the unit in a diffusion furnace into which oxygen or water vapor is introduced as an oxidant to thermally grow the exposed portions of the silicon into silicon dioxide layer 46. Preferably, the thickness of silicon dioxide layer 46 is 1,000 Angstroms. The growth of the silicon dioxide layer 46 takes place only in the channel and source and drain regions of the transistors as shown in FIG. 10. The silicon in the channel regions 19, 27 of the first and third transistors respectively contain some of the implanted boron atoms. Since some of this silicon crystal is consumed during the oxidation process, the number of implanted atoms in the surface of the crystal is reduced in these channel regions by the oxidation process. Of course, there are no implanted ions in the channel regions of the second and fourth transistors. Therefore, this growth step does not affect the electrical properties of these transistors.

The electrical properties of the source and drain regions remain unaffected also.

During the gate oxidation, approximately 1,000 Angstroms of oxide is grown in the channel, source and drain regions. About 450 Angstroms of silicon in the channel regions is consumed in this step. This 450 Angstroms of silicon contains an appreciable fraction of the total boron implant dose. Therefore, the quantity of implanted boron in the channel regions 19, 27 of the first and third transistors respectively is reduced below that in the surrounding field areas 33. By controlling the gate oxidation conditions, i.e. time and temperature, some degree of independent control of the threshold voltages corresponding to a given field inversion voltage can be obtained. Furthermore, this area of reduced boron implant level corresponds exactly to the channel region of the first and third devices. Some automatic alignment scheme between the doped field and these transistors is required for certain types of logic circuits. For example, enhancement mode devices are commonly used as pass devices in dynamic circuits. If there is a misalignment between the doped field and the sides of the enhancement mode channel, a small parasitic depletion mode device connected in parallel with the enhancement mode transistors will be present, rendereing the use of an enhancement mode transistor as a pass device extremely limited, if not impossible.

Further, since the unit is heated to cause the growth, this step also acts as an annealing step. Such is necessary to activate the implanted boron atoms to demonstrate the desired properties within the substrate.

Figure 11:
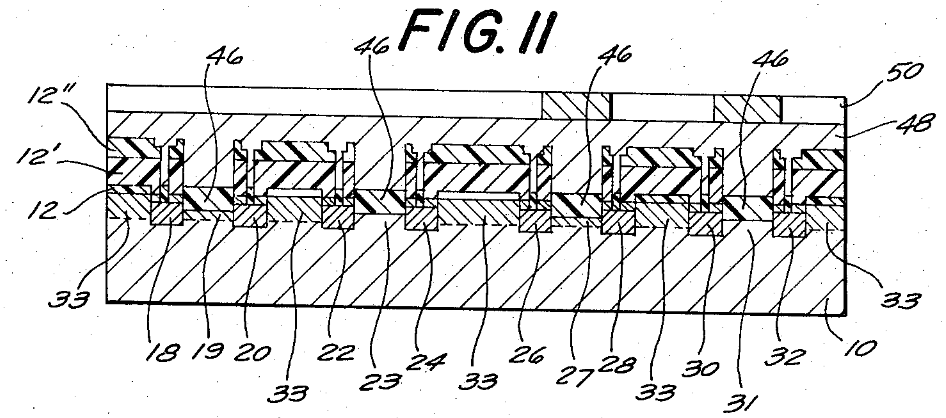
FIG. 11 is a view similar to FIG. 10 but showing the unit with the fourth photoresist layer and mask present thereon.
Figure 12:
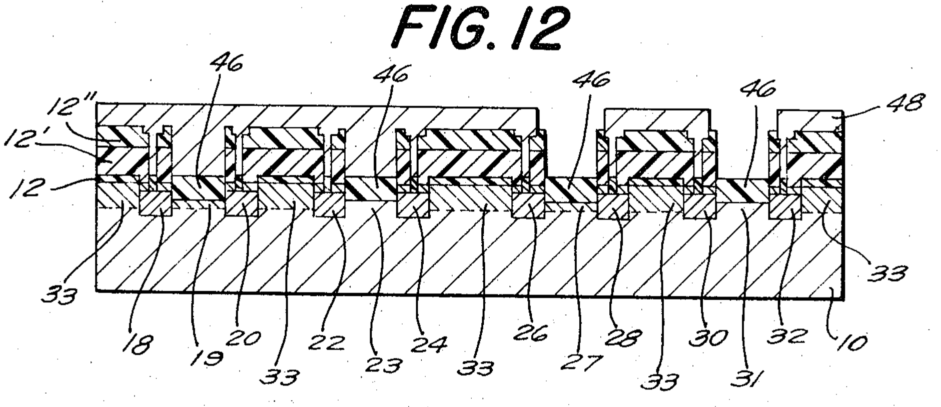
FIG. 12 is a view similar to FIG. 11 but showing the unit after removal of the mask and the portions of the third photoresist layer corresponding to the channel regions of the third and fourth devices.

As shown in FIG. 11, a photoresist layer 48 and a mask 50 are then formed on the surface of the unit. Mask 50 has opaque regions aligned with the third and fourth transistors. The unit is exposed to a beam of collimated ultraviolet light and the unpolymerized portions are photoresist layer 48 and mask 50 removed. As shown in FIG. 12, the remaining polymerized portions of layer 48 form an ion implantation mask covering the surface of the unit except for the channel regions of the third and fourth transistors.

Figure 13:
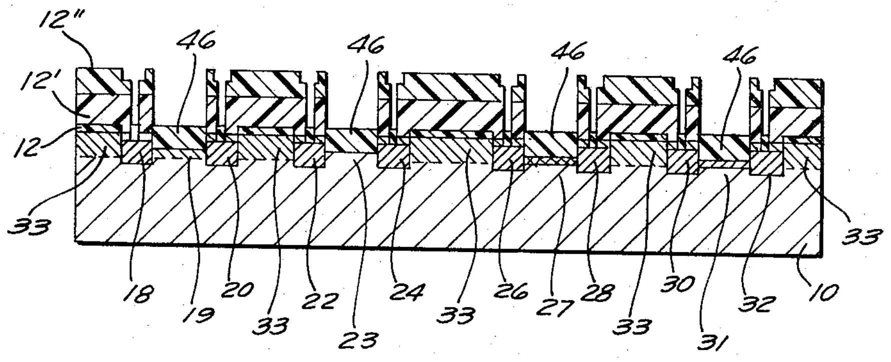
FIG. 13 is a view similar to FIG. 12 but showing the unit after the second ion implantation has been performed and the remaining portions of the photoresist layer removed.
Figure 14:
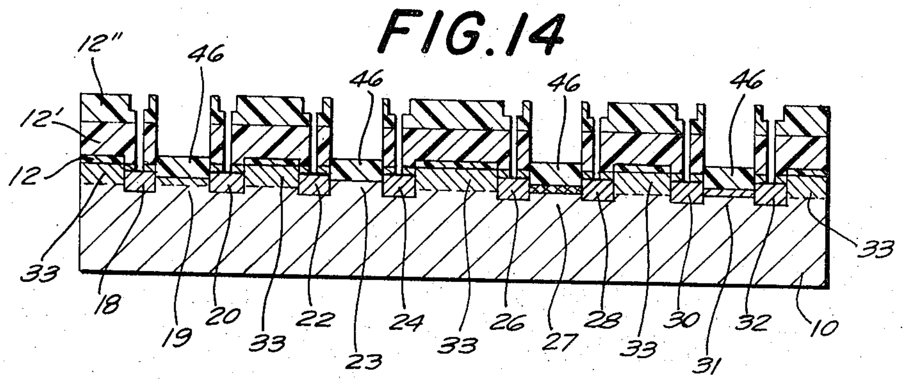
FIG. 14 is a view similar to FIG. 13 but showing the unit with the source and drain contact holes reopened.

The unit is exposed to a stream of high energy ions of any appropriate element which will produce N-type regions in the substrate. For example, phosphorous ions have proved effective for this purpose. Again, the energy of the ions is controlled so that they penetrate into substrate 10 only in the channel regions of transistors three and four. The thickness of oxide layers 12, 12', 12'' and photoresist layer 48 prevents the phosphorous ions from reaching all other portions of the substrate. After the phosphorous implant and removal of the remaining portions of photoresist layer 48, the unit appears as shown in FIG. 13. Phosphorous ions of 160 KeV may be utilized to obtain the desired concentration of $4.5 \times 10^{11}/Cm^2$.

The phosphorous atoms are present in the channel regions 27, 31 of the third and fourth transistors, respectively. These atoms are represented in the drawings by hatching which starts at the bottom of these areas and extends to the top thereof in a rightward direction. The area containing both boron and phosphorous atoms (channel region of third transistor) has hatching in both directions.

At this point, there are five separate impurity concentrations present in the semiconductor substrate. In the channel region 19 of the first transistor, a reduced concentration of boron impurities is present. In the channel region 23 of the second transistor, no impurities are present. In the channel region 27 of the third transistor, a combination of phosphorous atoms and reduced concentration of boron atoms are present. In the channel region 31 of the fourth transistor, only phosphorous atoms are present. In all field regions, a concentration of boron atoms approximately equal to the originally implanted concentration is present. The concentration and type of impurities present in the channel regions of each transistor will determine the threshold voltage thereof.

Figure 15:
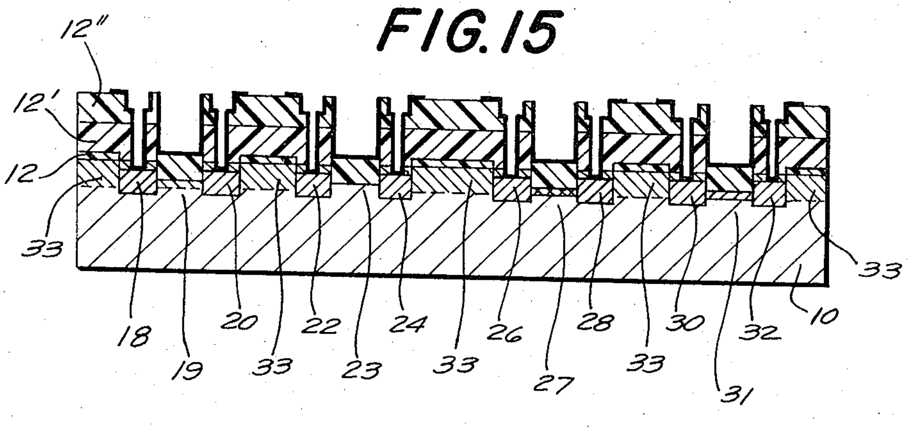
FIG. 15 is a view similar to FIG. 13 but showing the source, drain and gate electrodes formed.

The unit is annealed to lower the surface charge per unit area ($Q_{ss}$) and to activate the phosphorous implant. Another photo etching process (not shown) is performed, precisely as described above, to again open contact holes in the insulating layers in alignment with the source and drain regions of each of the transistors. A layer of conductive material, such as aluminum, is then placed on the surface of the unit and a last photo etching step is performed to delineate source, drain and gate electrodes for each of the transistors in the conventional manner (shown in FIG. 15 in heavy lines). The aluminum is then annealed and the wafer appears as illustrated in FIG. 15. Thereafter, a protective overlay oxide may be placed on the wafer, if desired.

The original substrate was chosen to be an N-type substrate sliced in the (100) plane. The first transistor (only boron impurities in the channel region) will be an enhancement mode device having a threshold voltage of +1 volts. The second transistor (no impurity in the channel region) will be a depletion mode device having a threshold voltage of near zero volts. The third transistor (having both boron and phosphorous impurities in the channel region) will be a depletion mode device having a threshold voltage of −1 volts. This threshold voltage is a result of the aggregate effect of both impurity concentrations. The phosphorous overcomes the effects of the boron in order to achieve a negative threshold voltage but the boron reduces the magnitude of the negative threshold voltage which would have been achieved by a phosphorous implant alone. The fourth transistor (only phosphorous impurities in the channel region) will be depletion mode transistor having a threshold voltage of −3 volts.

If a substrate sliced along the (111) plane had been originally chosen, the second transistor (no implant in the channel region) would have been a depletion mode device having a threshold voltage of −1 volt. This is because of the characteristics of a substrate sliced along this plane. The remaining transistors, if desired, could have the same threshold voltage as those above, if the implant levels are suitably adjusted. However, the gain factor of the transistors formed on substrates sliced on the (100) plane is better than those sliced on the (111) plane, and it is, therefore desirable to use the (100) plane.

In addition to the fabrication of large-scale integrated circuits, numerous single transistors of both the enhancement and depletion mode types have been fabricated with varying source-to-drain spacings for the purpose of characterizing the process. Utilizing a gate oxide thickness of 1,000 Angstroms and a relatively long (1 mil.) source-to-drain spacing in order to minimize the effects of uncertainties in channel length, enhancement mode devices having thresholds of $+0.85 \pm 0.3$ volts and depletion mode devices having thresholds of $-2.5 \pm 0.3$ volts have been obtained. These circuits have a field inversion voltage of between 15 to 17 volts and a junction breakdown voltage of approximately 35 volts. In addition to these values, body effect coefficient (change of threshold voltage with source to substrate bias) and the transconductance of the transistors have been measured. Values of the body effect coefficient range from 0.4 to 0.6, depending upon the actual substrate resistivity. These values show that the depth of the implanted ion is in general less than the thickness of the surface deplection region.

The observed values of the gain factor are quite different for enhancement and depletion mode devices. Measured values for enhancement mode devices are 22 ± 2 micro amps/volt$^2$ and for depletion mode devices 30 ± 2 micro amps/ volt$^2$. The difference between enhancement mode and depletion mode gain factors has been a constant feature of all N-channel ion implant processing experiments carried out on both (100) material and (111) material. A possible explanation of this difference lies in the shape of the potential near the surface of the silicon in the cases of the enhancement and depletion mode transistors. These calculations show that for depletion mode transistors made by ion implant, the miximum of the potential in the silicon occurs slightly below the surface, whereas the maximum potential in the silicon for enhancement mode transistors will occur at the surface of the semiconductor. For channels formed below surface, charge carrier mobilities closer to bulk mobility than surface mobility due to the reduction in the surface scattering contribution to the mobility might be expected. This may account for the difference in transconductance.

The present invention has been described relating to the formation of four devices each with a different threshold voltage for purposes of illustration. However, the process can also be used to produce integrated circuits with either devices having three threshold voltages or devices having two threshold voltages, as desired. In a circuit having devices with three threshold voltages, four combinations are possible: a device with no implant and one each with a P-type and an N-type implant; one device with each type of implant and one with both types; one device with both, one device with just N-type impurities and one with none; and one with both, one with just P-type impurities and one with none. In a circuit having devices with two threshold voltages, there are three novel possibilities: one device with only N-type impurities and one with both; one device with only P-type impurities and one with both; and one with both types and one with no impurities.

Since the concentrations of both impurities can be accurately controlled, a vast variety of circuits having devices with several different threshold voltages can be fabricated according to the desired operating characteristics of the circuit by varying the concentrations and locations of the implants. Therefore, through the use of the present invention a great deal of variety can be achieved in the fabrication of integrated circuits which was heretofore not possible.

The process of the present invention has the advantage of being able to form an integrated circuit having both enhancement mode and depletion mode transistors of various thresholds. The process utilizes two ions implantation steps which achieve devices having a multiplicity of thresholds as well as a doped field for the elimination of field inversion problems. Further, the process can be performed with conventional processing equipment and utilizes only known processing techniques.

A single preferred embodiment of the process of the present invention has been specifically disclosed herein for purpose of illustration. It is apparent that many variations and modifications may be made upon the specific method disclosed herein. It is intended to cover all of these variations and modifications which fall within the scope of this invention as defined by the appended claims.

We claim:

1. A process for forming metal oxide semiconductor devices having a multiplicity of threshold voltages on a single semiconductor substrate comprising the steps of doping selected portions of the exposed substrate with a dopant of conductivity-determining type opposite the conductivity type of the substrate to form source and drain regions for a plurality of semiconductor devices, introducing a first conductivity-determining type impurity into the substrate at the surface thereof in regions corresponding to first selected devices and not in regions corresponding to second selected devices, and introducing a second conductivity type determining impurity into the substrate at the surface thereof in regions corresponding to said second selected devices, and forming the source, drain and gate electrodes for each device.

2. In the process of claim 1, also introducing said second conductivity type determining impurity into the substrate at the surface thereof in regions corresponding to at least some of said first selected devices.

3. The process of claim 2, in which there are third selected devices where neither of said conductivity determining impurities are introduced.

4. The process of claim 1, in which there are third selected devices where neither of said conductivity determining impurities are introduced.

5. The method of claim 1 wherein the step of introducing a conductivity type impurity comprises the steps of covering the substrate with an appropriately configured ion implantation mask and exposing the surface of the unit to a beam of conductivity-determining type ions.

6. The method according to claim 1 wherein said first conductivity-determining type impurity is a P-type dopant.

7. The method of claim 6 wherein said P-type dopant comprises boron ions.

8. The method of claim 1 wherein said second conductivity-determining type impurity is an N-type dopant.

9. The method of claim 8 wherein said N-type dopant comprises phosphorous ions.

10. The method according to claim 8 wherein said first conductivity-determining type impurity is a P-type dopant.

11. The method of claim 9 wherein said P-type dopant comprises boron ions.

12. The process of claim 1 wherein first, second, and third devices having three different threshold voltages are formed and wherein said first selected devices comprise said first device and wherein said second selected devices comprise said second device.

13. The process of claim 2 wherein first, second, and third devices having three different threshold voltages are formed and wherein said first selected devices comprise said first and second device and wherein said second selected devices comprise said second and third device.

14. The process of claim 2 wherein first, second, and third devices having three different threshold voltages are formed and wherein said first selected devices comprise said first device and wherein said second selected devices comprise said first and said second device.

15. The process of claim 2 wherein first, second, and third devices having three different threshold voltages are formed and wherein said first selected devices comprise said first and said second device and wherein said second selected devices comprise said second device.

16. The process of claim 2 wherein first and second devices having two different threshold voltages are formed and wherein said first selected devices comprises said first device and said second selected devices comprises said first and said second device.

17. The process of claim 2 wherein first and second devices having two different threshold voltages are formed and wherein said first selected devices comprises said second device and said second selected devices comprise said second device.

18. The process of claim 2 wherein first and second devices having two different threshold voltages are formed and wherein said first selected devices comprise said first and said second device and wherein said second selected devices comprise said first device.

19. A process for forming four metal oxide semiconductor devices on a single semiconductor substrate, each of the devices having a different threshold voltage comprising the steps of forming a first insulating layer on the surface of the substrate, removing portions of the first insulating layer to form a pair of spaced openings therein for each device to be formed, doping the exposed substrate to form source and drain regions for each device, forming a second insulating layer on the unit, covering the channel regions of the third and fourth devices with an implantation mask and exposing the unit to a beam of P-type determining ions, removing the mask, removing the insulating layers in the channel regions of each of the devices growing an oxide layer in the channel region of each device, covering the second and fourth devices with an ion implantation mask, exposing the unit to a beam of N-type determining ions, and forming the source, drain and gate electrodes for each device, whereby each of the devices has a different threshold voltage.

* * * * *

UNITED STATES PATENT AND TRADEMARK OFFICE
CERTIFICATE OF CORRECTION

PATENT NO. : B1 3,868,274

DATED : July 26, 1988

INVENTOR(S) : Hubar et al.

It is certified that error appears in the above—identified patent and that said Letters Patent is hereby corrected as shown below:

Title Page, first column, line 18
after "Filed: Jan. 2," change "1975" to --1974--

Column 2, line 7 in Claim 21
after "first," insert: --second--

Signed and Sealed this

Fourth Day of April, 1989

Attest:

DONALD J. QUIGG

Attesting Officer

Commissioner of Patents and Trademarks

REEXAMINATION CERTIFICATE (899th)

United States Patent [19]

[11] B1 3,868,274

Hubar et al.

[45] Certificate Issued Jul. 26, 1988

[54] METHOD FOR FABRICATING MOS DEVICES WITH A MULTIPLICITY OF THRESHOLDS ON A SINGLE SEMICONDUCTOR SUBSTRATE

[75] Inventors: Robert J. Hubar, Bountiful; Kent F. Smith, Salt Lake City; James N. Fordemwalt, Salt Lake City; John W. Hanson, Salt Lake City, all of Utah

[73] Assignee: General Instrument Corporation, Newark, N.J.

Reexamination Request:
No. 90/000,990, Apr. 22, 1986

Reexamination Certificate for:

Patent No.: 3,868,274
Issued: Feb. 25, 1975
Appl. No.: 430,025
Filed: Jan. 2, 1975

[51] Int. Cl.[4] .......... H01L 21/265
[52] U.S. Cl. .......... 437/45; 148/DIG. 18; 148/DIG. 53; 357/23.12; 357/41; 437/27; 437/41; 437/56; 437/913; 437/941
[58] Field of Search .......... 148/1.5, 187; 29/571, 29/576 B; 357/23.12

[56] References Cited

U.S. PATENT DOCUMENTS

| | | | |
|---|---|---|---|
| 3,653,978 | 4/1972 | Robinson et al. . | |
| 3,775,191 | 11/1973 | McQuhae | 148/1.5 |
| 3,789,504 | 2/1974 | Jaddam | 29/571 |
| 3,895,468 | 6/1975 | Ito | 148/1.5 |
| 3,895,966 | 7/1975 | MacDougall et al. | 148/1.5 |

OTHER PUBLICATIONS

Denhard et al., IBM-TDB, vol. 16 (1973) 1530.
Forbes, L., IBM-TDB, 15 (1972) 1143.
Johnson, W. S., IBM-TDB, 15 (1972) 660.
Höfflinger et al., Siemens Forschg. u. Entwickl. Ber. Bd. 1, Apr. 1972, p. 362.
Forbes, "In-Channel Ion-Implanted Enhancement/Depletion FET Circuit and Fabrication Technology", published in I.E.E.E. Journal of Solid State Circuits, Jun. 1973, pp. 226-230.
Fang et al., "Electron Beam Fabrication of Ion-Implanted High Performance FET Circuits", published in the Journal of Vacuum Science Technology, vol. 10, No. 6, Nov./Dec. 1973, pp. 1082-1085.
MacPherson, "The Adjustment of MOS Transistor Threshold Voltage by Ion Implantation", Applied Physics Letters, vol. 18, No. 11, Jun. 1, 1971.

*Primary Examiner*—William D. Larkins

[57] ABSTRACT

The process includes the steps of doping selected portions of the substrate with a dopant of conductivity-determining type opposite the conductivity type of the substrate to form source and drain regions for a plurality of semiconductor devices. A first conductivity-determining type impurity is then introduced into the substrate at the surface thereof in regions corresponding to a first set of selected devices and not in regions corresponding to a second set of selected devices. A second conductivity type determining impurity is then introduced into the substrate of the surface thereof in regions corresponding to the second set of selected devices. The second conductivity type determining impurity is also introduced in regions corresponding to at least some of the first set of selected devices. There may be a third set of selected devices where neither of the conductivity type determining impurities are introduced. The source, drain and gate electrodes for each devices are then formed.

Preferably, the introduction of the conductivity type determining impurities is achieved by means of ion implantation. The resulting substrate may have devices having as many as four different threshold voltages depending upon which, if any, of the impurities are implanted in the channel regions of the particular devices. By controlling the relative impurity concentrations, the threshold voltages of the devices may be accurately determined. Further, the implantation procedures perform the additional function of doping the field areas to substantially reduce parasitic transistor action between the devices caused by field inversion.

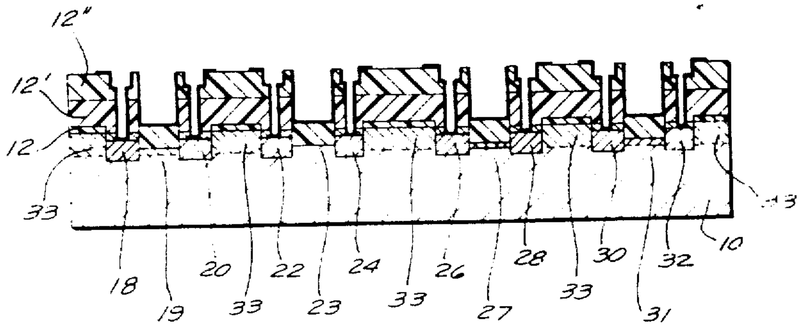

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 19 is confirmed.

Claims 1-18 are cancelled.

New claims 20-23 are added and determined to be patentable.

*20. A process for forming metal oxide semiconductor devices having multiplicity of threshold voltages on a single semiconductor substrate comprising the steps of doping selective portions of the exposed substrate with a dopant of conductivity determining type opposite the conductivity type of the substrate to form source and drain regions and define channel regions therebetween for a plurality of semiconductor devices, introducing a first conductivity determining type impurity into the substrate at the surface thereof in substantially the entire channel regions corresponding to first selected devices and not in channel regions corresponding to second selected devices, and introducing a second conductivity type determining impurity into the substrate at the surface thereof in substantially the entire channel regions corresponding to said second selected devices, also introducing said second conductivity type impurity into the substrate at the surface thereof in regions corresponding to at least some of said first selected devices, and forming the source, drain and gate electrodes for each device, wherein first, second and third devices having three different threshold voltages are formed and wherein said first selected devices comprise said first and second device and wherein said second selected devices comprise said second and third device.*

*21. A process for forming metal oxide semiconductor devices having a multiplicity of threshold voltages on a single semiconductor substrate comprising the steps of doping selected portions of the exposed substrate with a dopant of conductivity determining type opposite the conductivity type of the substrate to form source and drain regions and define channel regions therebetween for a plurality of semiconductor devices, introducing a first conductivity determining type impurity into the substrate at the surface thereof in substantially the entire channel regions corresponding to first selected devices and not in channel regions corresponding to second selected devices, and introducing a second conductivity type determining impurity into the substrate at the surface thereof in substantially the entire channel regions corresponding to said second selected devices, also introducing said second conductivity type determining impurity into the substrate at the surface thereof in regions corresponding to at least some of said first selected devices, and forming the source, drain and gate electrodes for each device, wherein first, and third devices having three different threshold voltages are formed and wherein first selected devices comprise said first device and wherein said second selected devices comprise said first and second device.*

*22. A process for forming metal oxide semiconductor devices having a multiplicity of threshold devices on a single semiconductor substrate comprising the steps of doping selected portions of the exposed substrate with a dopant of conductivity determining type opposite the conductivity type of the substrate to form source and drain regions and define channel regions therebetween for a plurality of semiconductor devices, introducing a first conductivity determining type impurity into the substrate at the surface thereof in substantially the entire channel regions corresponding to first selected devices and not in channel regions corresponding to second selected devices, and introducing a second conductivity type determining impurity into the substrate at the surface thereof in substantially the entire channel regions corresponding to said second selected devices, also introducing said second conductivity type determining impurity into the substrate at the surface thereof in regions corresponding to at least some of said first selected devices, and forming the source, drain and gate electrodes for each device, wherein first, second and third devices having three different threshold voltages are formed and wherein said first selected devices comprise said first and said second device and wherein said second selected devices comprise said second device.*

*23. A process for forming metal oxide semiconductor devices having a multiplicity of threshold voltages on a single semiconductor substrate comprising the steps of doping selected portions of the exposed substrate with a dopant of conductivity determining type opposite the conductivity type of the substrate to form source and drain regions and define channel regions therebetween for a plurality of semiconductor devices, introducing a first conductivity determining type impurity into the substrate at the surface thereof in substantially the entire channel regions corresponding to first selected devices and not in channel regions corresponding to second selected devices, and introducing a second conductivity type determining impurity into the substrate at the surface thereof in substantially to the entire channel regions corresponding to said selected devices, also introducing said second conductivity type determining type impurity into the substrate at the surface thereof in regions corresponding to at least some of said first selected devices, masking the channel regions corresponding to third selected devices as the first and second conductivity determining impurities are introduced, and forming the source, drain and gate electrodes for each device.*

* * * * *